US012574044B2

(12) United States Patent

Easter et al.

(10) Patent No.: US 12,574,044 B2

(45) Date of Patent: Mar. 10, 2026

(54) SYSTEM AND METHOD FOR MULTI-DIMENSIONAL DIGITAL-TO-ANALOG CONVERTER (DAC)

(71) Applicant: Avago Technologies International Sales Pte. Limited, Singapore (SG)

(72) Inventors: Jacob K. Easter, Fort Collins, CO (US); Doug Spannring, Fort Collins, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 181 days.

(21) Appl. No.: 18/498,125

(22) Filed: Oct. 31, 2023

(65) Prior Publication Data

US 2025/0141467 A1 May 1, 2025

(51) Int. Cl.
*H03M 1/68* (2006.01)

(52) U.S. Cl.
CPC ................................... *H03M 1/682* (2013.01)

(58) Field of Classification Search
CPC ............................. H03M 1/742; H03M 1/682
See application file for complete search history.

(56) References Cited

U.S. PATENT DOCUMENTS

| | | | | |
|---|---|---|---|---|
| 6,674,377 B1 * | 1/2004 | Li | ........................... | G11C 29/02 |
| | | | | 341/145 |
| 6,741,195 B1 * | 5/2004 | Cho | .................... | H03M 1/0872 |
| | | | | 341/135 |

| | | | | |
|---|---|---|---|---|
| 6,927,719 B1 * | 8/2005 | Siniscalchi | ......... | H03M 1/0604 |
| | | | | 341/144 |
| 7,535,397 B1 * | 5/2009 | Chiou | ..................... | H03M 1/68 |
| | | | | 341/145 |
| 7,843,372 B2 | 11/2010 | Kawano | | |
| 8,264,392 B1 * | 9/2012 | Zarei | ....................... | H03M 3/47 |
| | | | | 341/155 |
| 9,444,487 B1 * | 9/2016 | Dempsey | .............. | H03M 1/785 |
| 9,941,795 B1 | 4/2018 | Mayega et al. | | |
| 10,115,760 B2 | 10/2018 | Doege | | |
| 10,469,097 B1 * | 11/2019 | Bothra | ................ | H03F 3/45188 |
| 10,778,148 B1 * | 9/2020 | Ali | ........................ | H03D 7/1458 |
| 10,819,365 B1 * | 10/2020 | Nguyen | ................ | H03M 3/346 |
| 11,016,732 B1 * | 5/2021 | Far | ....................... | G06N 3/0499 |
| 11,507,761 B2 | 11/2022 | Buchanan et al. | | |
| 11,990,916 B2 * | 5/2024 | Agrawal | ............. | H03M 1/0863 |

(Continued)

OTHER PUBLICATIONS

Extended European Search Report on Appln. No. 24199791.5 dated Mar. 17, 2025.

*Primary Examiner* — Lam T Mai

(74) *Attorney, Agent, or Firm* — Foley & Lardner LLP

(57) ABSTRACT

A device may include a digital-to-analog converter (DAC), including a current source, circuitry to mirror the current source, the circuitry including a transistor coupled to the current source, and a plurality of output paths, each output path of the plurality of output paths including a first switch to selectively configure a first transistor to mirror the current source, wherein each output path corresponds to a value of a respective bit of a first digital signal, and a plurality of cells, each cell of the plurality of cells including a second switch to selectively couple a second transistor to a corresponding one of the plurality of output paths, wherein each of the plurality of cells corresponds to a value of a respective bit of a second digital signal.

17 Claims, 5 Drawing Sheets

10

(56) References Cited

U.S. PATENT DOCUMENTS

| | | | |
|---|---|---|---|
| 2004/0164887 A1* | 8/2004 | Skones | H03M 1/0624 |
| | | | 341/144 |
| 2005/0052298 A1* | 3/2005 | Moon | H03M 1/687 |
| | | | 341/135 |
| 2005/0122160 A1* | 6/2005 | Abadeer | G05F 3/242 |
| | | | 327/538 |
| 2007/0090981 A1* | 4/2007 | Chou | H03M 1/68 |
| | | | 341/144 |
| 2007/0279270 A1* | 12/2007 | Chida | H03M 1/0612 |
| | | | 341/144 |
| 2010/0283642 A1* | 11/2010 | Lai | H03M 1/1061 |
| | | | 341/120 |
| 2012/0139766 A1* | 6/2012 | Cyrusian | H03M 1/0845 |
| | | | 341/120 |
| 2012/0306678 A1* | 12/2012 | Hezar | H03M 1/66 |
| | | | 341/146 |
| 2013/0057420 A1* | 3/2013 | Oku | H03M 1/0604 |
| | | | 327/566 |
| 2014/0146914 A1* | 5/2014 | Kuttner | H03M 1/66 |
| | | | 375/295 |
| 2015/0102949 A1* | 4/2015 | Rajasekhar | H03M 1/08 |
| | | | 341/118 |
| 2016/0056832 A1* | 2/2016 | Deloge | H03M 1/0881 |
| | | | 341/144 |
| 2016/0248432 A1* | 8/2016 | Naderi Alizadeh | H03M 1/002 |
| 2020/0099389 A1* | 3/2020 | Sung | H03M 1/785 |
| 2022/0045692 A1* | 2/2022 | Birdsong | H03M 3/444 |
| 2024/0113727 A1* | 4/2024 | Egan | H03M 1/742 |
| 2024/0429937 A1* | 12/2024 | Zhou | H03M 1/742 |

* cited by examiner

40

502 Provide input current

504 Provide signal to plurality of output paths in response to receipt of the input signal 506 Receive first signal to control first current from first transistor and receive second signal to control second current from second transistor.

508 Generate output current including the first current and the second current

50

SYSTEM AND METHOD FOR MULTI-DIMENSIONAL DIGITAL-TO-ANALOG CONVERTER (DAC)

FIELD OF THE DISCLOSURE

This disclosure generally relates to systems and methods for digital-to-analog converters (DACs), and more particularly to multi-dimensional DACs implemented by mirroring a current source in a reliable and efficient manner.

BACKGROUND

In integrated circuits, a DAC (e.g., current-steering DAC) can be implemented by mirroring or replicating a current flowing in a branch of a circuit and generating an output current in an output branch. A multi-dimensional DAC may produce an output current that is multiplicative in terms of two or more input control words. Such a multi-dimensional DAC can be achieved using multiple input control signals and successive current mirrors, which however, are susceptible to power supply noise and require added area and power consumption.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
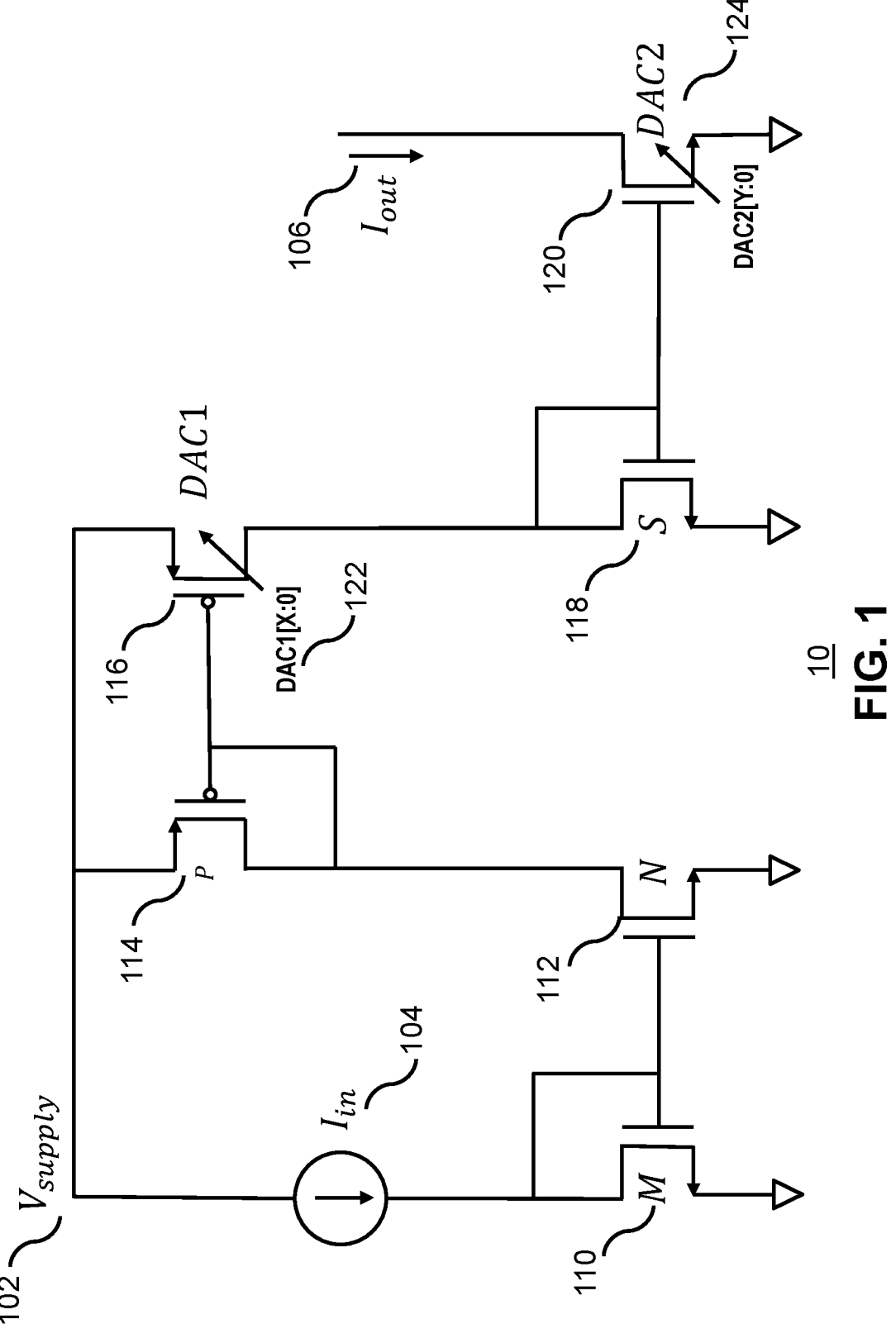
FIG. 1 is a schematic diagram of a traditional current mirror.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Various embodiments disclosed herein are related to a device, a system, circuitry, or a DAC including a current source, circuitry to mirror the current source (e.g., a current generated by the current source), and a plurality of cells. In some embodiments, the DAC may be or include a circuit, circuitry, a device, a system, or any component that can convert a digital signal into an analog signal.

In some embodiments, the current source may be or include a circuit, circuitry, or any component that generates a current (e.g., a reference current, an input current, etc.) which may be independent of the voltage across the current source. The current source can be electrically coupled to a transistor (hereinafter referred to as a reference transistor) of the circuitry and provide a current thereto. In some embodiments, the current source can be electrically coupled to a voltage supply. For example, the current source can be electrically coupled to a gate voltage (e.g., N-bias for N-Metal-oxide-semiconductor (MOS) device, P-bias for P-MOS device, etc.). In some embodiments, the current source can generate a constant and/or precise current.

In some embodiments, the circuitry or current mirror circuit described herein may be or include a circuit, circuitry, or any circuitry component that can copy a current (e.g., a reference current, an input current, etc.) through an active device by controlling the current in another active device, keeping an output current constant regardless of loading. The circuitry or current mirror circuit can include the reference transistor and a plurality of output paths. The circuitry can output an output current (e.g., a mirrored current) in response to the reference transistor receiving a current from the current source.

In some embodiments, the reference transistor may be a semiconductor device (e.g., a bipolar junction transistor (BJT), a MOS field-effect transistor (MOSFET), etc.), or any transistor that can control the current of the device. In some embodiments, the reference transistor can be coupled to the current source and receive a current from the current source. In response to receipt of the current from the current source, the reference transistor can provide a signal (e.g., a voltage signal) to the plurality of output paths.

In some embodiments, any of the plurality of output paths may be or form a circuit, circuitry, or any component which can output at least a portion of an output current (e.g., a mirrored current) in response to the reference transistor receiving a current from the current source. The plurality of output paths can in combination output the output current to mirror the current from the current source (e.g., an input current, a reference current). Each of the plurality of output paths may include a switch (e.g., a first switch) and a transistor (e.g., a first transistor). In some examples, the output current may be an output signal of the DAC, which is output in response to receipt of the input current.

In some embodiments, the first transistor may be a semiconductor device (e.g., a BJT, a MOSFET, etc.), or any transistor that can control a current flowing in the corresponding output path. In some embodiments, the first transistor may be substantially similar or identical to the reference transistor. The first transistor can control a flow of a current in response to receipt of a signal (e.g., a voltage signal) from the reference transistor. In some embodiments, the first transistor may be coupled to a second transistor.

In some embodiments, the first switch may be any semiconductor device (e.g., a BJT, a MOSFET, etc.), any semiconductor diode, any semiconductor switch, or any component that can control a current flow of the corresponding output path that the first switch is coupled to. The first switch can control a current flow in the corresponding output path thereby selectively configuring the first transistor (or a set of transistors including the first transistor and the second transistor) to output a portion of the output current (e.g., a mirrored current), which can be combined into the output current. The first switch can be controlled to determine whether the corresponding output path is to close or open (e.g., allowing for a current flow or not in the corresponding output path). When the first switch is closed (or turned on), the first switch allows the corresponding current (e.g., a current from the first transistor, a sum of currents from the first transistor and the second transistor, etc.) to flow through the corresponding output path and combine into the output current (e.g., a mirrored current). When the first switch is open (or turned off), the first switch disconnects the corresponding output path and prevents the corresponding current (e.g., a current from the first transistor, a sum of currents from the first transistor and the second transistor, etc.) from combining into the output current (e.g., a mirrored current). By controlling which first switches are open or closed, the device can output the output current (e.g., a current mirrored to the input current) by sum of the current(s) from the output path(s) whose first switch is closed.

In some embodiments, each of the plurality of output paths can correspond to a value of a respective bit of a first signal. In some embodiments, the first signal may be a digital signal, a logical signal, a binary signal, or any signal that can represent data as a sequence of discrete values. The first signal can include a respective bit to control the first switch of each of the plurality of output paths. The first signal can control an output current of the current mirror circuit. In some embodiments, the circuitry or current mirror circuit described herein can form a DAC. The first signal can be an input signal to the DAC and can control an output signal of the DAC (e.g., the output current of the current mirror circuit). When a DAC includes X output paths, an output of the DAC (e.g., the output current of the current mirror circuit) can be controlled by an input signal to the DAC, for example, the first signal DAC1<1:x>. For example, a first output path can be controlled by a first signal (e.g., DAC1<1>) and an x-th output path can be controlled by an x-th signal (e.g., DAC1<x>). For example, the output current can be an output signal of the DAC, which is output in response to receipt of the input current.

In some embodiments, the first switch can be configured to selectively couple the first transistor to the corresponding output path such that the first transistor outputs a current corresponding to the value of the respective bit of the first signal. In some embodiments, an output current (e.g., a mirrored current) can be output by selectively configuring each first transistor of the plurality of output paths. In some embodiments, the first signal indicates a unary code, which may be a thermometer code, a prefix-free code, a self-synchronizing code, or any code that represents a natural number with a code of length.

In some embodiments, each of the plurality of output paths can include a plurality of cells electrically coupled to the corresponding first transistor. As described herein, any of the plurality of cells can be or include a circuit, circuitry, or any circuitry component that includes a pair of a transistor and a switch. Each of the plurality of cells includes a second switch and a second transistor. The second transistor may be a semiconductor device (e.g., a BJT, a MOSFET, etc.), or any transistor that can control a flow of a current in response to receipt of a signal (e.g., a voltage signal). In some embodiments, the second transistor may be substantially similar or identical to the first transistor and/or the reference transistor. The second transistor can provide the generated signal to the corresponding output path that the second transistor is coupled to. For example, the second transistor can be controlled to output a second current, which can be combined with a first current output from the first transistor coupled in the corresponding output path. The combined current can flow into the corresponding output path by closing (or turning on) the first switch.

The second switch may be any semiconductor device (e.g., a BJT, a MOSFET, etc.), any semiconductor diode, any semiconductor switch, or any component that can control a current flow of a current path that the second switch is coupled to. As described herein, the current path may be or include a circuit, circuitry, or any circuitry component through which a current can flow. The second switch can be coupled to the second transistor and can control a current flow in the corresponding path thereby selectively configuring whether to combine a current output from the second transistor into an output current (e.g., a mirrored current) in the corresponding output path. That is, the second switch can selectively couple the second transistor to the corresponding output path and allow the current output from the second transistor to combine with the current output from the first transistor. The second switch can be controlled to determine whether the corresponding path is to close or open (e.g., allowing for a current flow or not in the corresponding path). When the second switch is closed, the second switch allows the corresponding current (e.g., a current from the second transistor) to flow through the corresponding output path and combine with a current from the first transistor, thereby outputting a portion of the output current (e.g., a mirrored current), the portion flowing from the corresponding output path of the plurality of paths. When the second switch is open, the second switch disconnects the corresponding output path and prevents the corresponding current (e.g., a current from the second transistor) from combining with the current from the first transistor (or from combining into the output current). By controlling which second switches are open or closed, the device can determine an amount of currents to combine with the current from the first transistor.

In some embodiments, each of the plurality of cells can correspond to a value of a respective bit of a second signal (e.g., a second digital signal, etc.). In some embodiments, the second signal may be a digital signal, a logical signal, a binary signal, or any signal that can represent data as a sequence of discrete values. The second switch of each of the plurality of cells can be controlled by the second signal (e.g., the second digital signal), which can include a respective bit to control the corresponding switch (e.g., the second switch). In some embodiments, when an output path of the plurality of paths includes a first transistor and a first switch that are coupled to Y cells, including Y second transistors and Y second switches, a current from the first transistor of the Y second transistors (and/or the first switch of the Y second switches) can be controlled by a signal, DAC2<1> and a current from the y-th transistor of the Y second transistors (and/or the y-th switch of the Y second switches) can be controlled by a signal, DAC2<y>. In some embodiments, in response to the second switch of each of the plurality of cells selectively coupling the second transistor to the corresponding one of the plurality of output paths, the second transistor can be configured to output a current based on the value of the corresponding bit of the first digital signal and/or the value of the respective bit of the second digital signal. In some embodiments, the second signal indicates a unary code.

In some embodiments, the second switches in the plurality of cells of the plurality of output paths can share a same digital signal. For example, the plurality of cells in the first output path of the plurality of output paths can receive the second signal DAC2<1:y>, and the plurality of cells in any output path of the plurality of output paths can receive the same second signal DAC2<1:y>. For example, each of the first cells in the plurality of output paths can receive DAC2<1>, each of the second cells in the plurality of output paths can receive DAC2<2>, and each of the y-th second cells in the plurality of output paths can receive DAC2<y>. As discussed above, a current contribution of the plurality of cells in each of the plurality of output paths to the output current (e.g., a mirrored current) can be controlled by the first signal, for example, DAC1<1:x>. For example, the plurality of cells in the first output path of the plurality of output paths can be controlled by the first signal, DAC1<1>, the plurality of cells in the second output path of the plurality of output paths can be controlled by the first signal, DAC1<2>, and the plurality of cells in the x-th output path of the plurality of output paths can be controlled by the first signal, DAC1<x>.

In some examples, the plurality of cells within each of the plurality of output paths can be integrated into a macro cell or a structure that includes the first corresponding transistor and the first corresponding switch.

In some embodiments, the plurality of output paths and the plurality of cells can be configured to output a current corresponding to a result of multiplying a value of the first digital signal and a value of the second digital signal (e.g., DAC1·DAC2). For example, the output current can be a function of a result of multiplying a value of the first digital signal and a value of the second digital signal. For example, the output current, $I_{out}$, may be, $$I_{out} = I_{in} \cdot \frac{DAC1 \cdot DAC2}{M},$$

where M is a ratio constant associated with the transistors and $I_{in}$ is a current generated by the current source (e.g., a reference source). This allows for a multi-dimensional control of the output current by independently adjusting the signals DAC1 and DAC 2.

In some embodiments, the plurality of output paths and the plurality of cells can be configured to output a current by weighting at least one of the current from any of the plurality of output paths or the current from any of the plurality of cells. The weighting can be controlled by the first signal (received by the first switch, e.g., DAC1) and/or the second signal (received by the second switch, e.g., DAC2). For example, the weighting can be controlled by at least one of a step size, a relative signal size, a range of signals, etc. The output current, $I_{out}$, output by weighting can be defined as:

$$I_{out}(x, y) = I_{unit} \cdot \left(\sum\nolimits_{j=1}^{x} \alpha_j\right) \cdot \left[N + P \cdot \left(\sum\nolimits_{k=1}^{y} \alpha_k\right)\right],$$

where x is a DAC1 input code indicating a first signal (e.g., DAC1), y is a DAC2 input code indicating a second signal (e.g., DAC2), $I_{unit}$ is $I_{in}/M$, N is a gain coefficient for DAC1, P is a gain coefficient for DAC2, $\alpha_j$ is a weighting for the j-th DAC1 of the plurality of output paths, and $\alpha_k$ is a weighting for the k-th of the plurality of cells.

In some embodiments, the device disclosed herein may be or include a DAC configured to output a mirrored current of a current source (e.g., a reference current, an input signal, etc.). In response to receipt of the first signal (e.g., DAC1) and the second signal (e.g., DAC2) as an input, the DAC can output a mirrored current as an output. For example, the first signal may be a first digital signal for coarse tuning of the output of the DAC, and the second signal may be a second digital signal for fine tuning of the output of the DAC.

In some embodiments, the plurality of output paths and/or the plurality of cells can include first circuitry and second circuitry. The first circuitry includes a third transistor coupled to a plurality of third switches corresponding to the plurality of cells. For example, each of the plurality of third switches can be electrically coupled to each corresponding cell of the plurality of cells. The first circuitry can mirror a current flowing through a first current path, which can be used to output an output current (e.g., a mirrored current). Each of the plurality of third switches can be configured to selectively couple the corresponding cell of the plurality of cells to the first current path based on the value of the respective bit of the second digital signal, so that the output current can be provided through the first current path to the corresponding output path.

The second circuitry includes a fourth transistor coupled to a plurality of fourth switches corresponding to the plurality of cells. For example, each of the plurality of fourth switches can be electrically coupled to each corresponding cell of the plurality of cells. The second circuitry can provide a second current path. Each of the plurality of fourth switches can be configured to selectively couple the corresponding cell of the plurality of cells to the second current path based on the value of the respective bit of the second digital signal. The current provided through the second current path may not be used.

In some embodiments, when a cell of the plurality of cells receives a bit of the second digital signal having a first value (e.g., 1, 0), the third switch in the cell can be configured to couple the corresponding cell of the plurality of cells to the first current path and a fourth switch in the cell can be configured to disconnect the corresponding cell of the plurality of cells from the second current path. That is, in response to determining that a bit of the second digital signal has a first value, the third switch of the plurality of third switches corresponding to the bit of the second digital signal can be configured to couple the corresponding cell of the plurality of cells to the first current path and the fourth switch of the plurality of fourth switches corresponding to the bit of the second digital signal can be configured to disconnect the corresponding cell of the plurality of cells from the second current path.

In some embodiments, when a cell of the plurality of cells receives a bit of the second digital signal having a second value (e.g., 0, 1), the third switch in the cell can be configured to disconnect the corresponding cell of the plurality of cells from the first current path and the fourth switch in the cell can be configured to couple the corresponding cell of the plurality of cells to the second current path. That is, in response to determining that a bit of the second digital signal has a second value, the third switch of the plurality of third switches corresponding to the bit of the second digital signal can be configured to disconnect the corresponding cell of the plurality of cells from the first current path and the fourth switch of the plurality of fourth switches corresponding to the bit of the second digital signal can be configured to couple the corresponding cell of the plurality of cells to the second current path.

Various embodiments disclosed herein are related to a system including a current source a transistor coupled to the current source, a first digital-to-analog converter (DAC)

including a plurality of first cells, each cell of the plurality of first cells including a first switch to selectively configure, corresponding to a value of a respective bit of a first digital signal, a first transistor to mirror the current source, and a second DAC including a plurality of second cells, each cell of the plurality of second cells including a second switch to selectively couple, corresponding to a value of a respective bit of a second digital signal, a second transistor to a corresponding one of the plurality of first cells. The first DAC and the second DAC are configured to output a current corresponding to a result of multiplying values of the first digital signal and the second digital signal.

In some embodiments, each of the first digital signal and the second digital signal indicates a unary code.

In some embodiments, in selectively configuring the first transistor to mirror the current source, the first switch is configured to selectively couple the first transistor to an output path such that the first transistor outputs, through the output path, a current corresponding to the value of the respective bit of the first digital signal.

In some embodiments, in response to the second switch of each of the plurality of second cells selectively coupling the second transistor to the corresponding one of the plurality of first cells, the second transistor is configured to output a current based on the value of the corresponding bit of the first digital signal and the value of the respective bit of the second digital signal.

In some embodiments, the system can include first circuitry to mirror a current flowing through a first current path, the first circuitry including a third transistor coupled to a plurality of third switches corresponding to the plurality of second cells, and second circuitry to provide a second current path, the second circuitry including a fourth transistor coupled to a plurality of fourth switches corresponding to the plurality of second cells. Each of the plurality of third switches is configured to selectively couple a corresponding one of the plurality of second cells to the first current path based on the value of the respective bit of the second digital signal, and each of the plurality of fourth switches is configured to selectively couple the corresponding one of the plurality of second cells to the second current path based on the value of the respective bit of the second digital signal.

In some embodiments, in response to determining that a bit of the second digital signal has a first value, a switch of the plurality of third switches corresponding to the bit of the second digital value is configured to couple a corresponding cell of the plurality of second cells to the first current path and a switch of the plurality of second switches corresponding to the bit of the second digital value is configured to disconnect the corresponding cell of the plurality of second cells from the second current path. In some embodiments, in response to determining that the bit of the second digital signal has a second value, the switch of the plurality of third switches corresponding to the bit of the second digital signal is configured to disconnect the corresponding cell of the plurality of second cells from the first current path and the switch of the plurality of fourth switches corresponding to the bit of the second digital signal is configured to couple the corresponding cell of the plurality of second cells to the second current path.

Various embodiments disclosed herein are related to circuitry including a current source, a transistor coupled to the current source, an output path including a first switch to selectively configure, corresponding to a bit of a first digital signal, a first transistor to mirror the current source, and a plurality of cells, each cell of the plurality of cells including a second switch to selectively couple a second transistor to the output path. Each of the plurality of cells corresponds to a value of a respective bit of a second digital signal.

In some embodiments, each of the first digital signal and the second digital signal indicates a unary code.

In some embodiments, in selectively configuring the first transistor to mirror the current source, the first switch is configured to selectively couple the first transistor to the output path such that the first transistor outputs a current corresponding to the value of the bit of the first digital signal.

In some embodiments, in response to the second switch of each of the plurality of cells selectively coupling the second transistor to the output path, the second transistor is configured to output a current based on the value of the bit of the first digital signal and the value of the respective bit of the second digital signal.

In some embodiments, the output path and the plurality of cells are configured to output a current corresponding to a result of multiplying the value of the bit of the first digital signal and a value of the second digital signal.

In some embodiments, the circuitry can include first circuitry to mirror a current flowing through a first current path, the first circuitry including a third transistor coupled to a plurality of third switches corresponding to the plurality of cells, and second circuitry to provide a second current path, the second circuitry including a fourth transistor coupled to a plurality of fourth switches corresponding to the plurality of cells. Each of the plurality of third switches is configured to selectively couple a corresponding one of the plurality of cells to the first current path based on the value of the respective bit of the second digital signal. Each of the plurality of fourth switches is configured to selectively couple the corresponding one of the plurality of cells to the second current path based on the value of the respective bit of the second digital signal.

In some embodiments, in response to determining that a bit of the second digital signal has a first value, a switch of the plurality of third switches corresponding to the bit of the second digital signal is configured to couple a corresponding cell of the plurality of cells to the first current path and a switch of the plurality of fourth switches corresponding to the bit of the second digital signal is configured to disconnect the corresponding cell of the plurality of cells from the second current path. In response to determining that the bit of the second digital signal has a second value, the switch of the plurality of third switches corresponding to the bit of the second digital signal is configured to disconnect the corresponding cell of the plurality of cells from the first current path and the switch of the plurality of fourth switches corresponding to the bit of the second digital signal is configured to couple the corresponding cell of the plurality of cells to the second current path.

As disclosed herein, one or more transistors can be configured to mirror the current source. In some embodiments, the one or more transistors can be configured to duplicate the current source exactly. However, in some other embodiments, the one or more transistors can be configured to duplicate the current source within acceptable tolerance of a deviation, such as, for example, noise, settling time, etc. That is, the one or more transistors are not required to exactly duplicate the current source.

Embodiments in the present disclosure have at least the following advantages and benefits. In particular, the techniques disclosed herein provide improvements to multidimensional DACs configured to mirror a current source as an output.

First, embodiments in the present disclosure can provide useful techniques for preventing a noise that stems from a voltage supply and thus generating a reliable and accurate output current. By coupling one or more cells to a first transistor and a first switch (or integrating the one or more cells into a macro cell that includes the first transistor and the first switch), an output current can be free from a noise that can be carried from the voltage supply. This allows for accurate and reliable operation of multi-dimensional DACs.

Second, embodiments in the present disclosure can provide useful techniques for efficiently utilize a device area (e.g., fewer elements, flexible device arrangements, etc.) of multi-dimensional DACs. By incorporating a plurality of output paths each of which includes a plurality of cells within a single current mirror, rather than operating multiple mirroring circuits (e.g., successive current mirrors), the techniques disclosed herein reduce a device area (e.g., fewer elements, flexible device arrangements, etc.), while allowing for efficient operation of the multi-dimensional DACs.

Third, embodiments in the present disclosure can provide useful techniques for reducing a leakage current. The cells (e.g., the second switches and the second transistors) integrated into each of the plurality of output paths can output a mirrored current based on weighting factors for each cell and/or length scaling (e.g., rather than the width scaling). This can reduce a leakage current while improving accuracy of the DAC and power efficiency of the device.

Fourth, embodiments in the present disclosure can provide useful techniques for improving a settling time and switching performance. Using the second switches to control each cell of the plurality of cells in each of the plurality of output paths and the first switches to control each path of the plurality of output paths, a settling time and switching performance of the current mirror can be improved. Individual controlling of the first switches and the second switches can reduce a settling time to charge up and discharge the transistors. Instead, by controlling the individual first and/or second switches, a state of the current mirror (e.g., an output path) can be quickly switched from one to another.

Embodiments in the present disclosure can be applied to and/or compatible with various techniques, including but not limited to, a Numerical Controlled Oscillator (NCO) within a phase-locked loop (PLL) product, a numerically controlled oscillator (NCO).

FIG. 1 is a schematic diagram of a traditional current mirror 10. The traditional current mirror 10 includes a voltage supply 102 and a plurality of transistors 110, 112, 114, 116, 118. The voltage supply 102 can provide an input current 104 to the traditional current mirror 10. The traditional current mirror 10 can generate an output current 106 in response to receipt of the input current 104 and a first DAC signal 122 and a second DAC signal 124.

The plurality of transistors 110, 112, 114, 116, 118 are successively connected to form a two-dimensional DAC. Such a successive current mirror generates an output current susceptible to noise that stems from a power supply. For example, an overhead structure (including the transistor 114 and the transistor 116) is connected to the voltage supply 102, which makes a signal carried through the transistors (e.g., 114, 116, etc.) susceptible to a noise from the voltage supply 102, and thus make the output current 106 susceptible to the noise. In addition, as shown, the overhead structure requires an extra area, which increases an overall area of the current mirror and thus impedes efficient control of the device. Moreover, the traditional current mirror 10 suffers from a delayed settling time to generate the output current 106. Since the plurality of transistors 110, 112, 114, 116, 118 are successively connected, when the current mirror 10 is not to generate the output current 106, the plurality of transistors 110, 112, 114, 116, 118 are fully turned off (e.g., fully discharged). This requires a certain amount of time to charge up and causes a delay in switching from one state to another (e.g., switching from a path to another).

Figure 2:
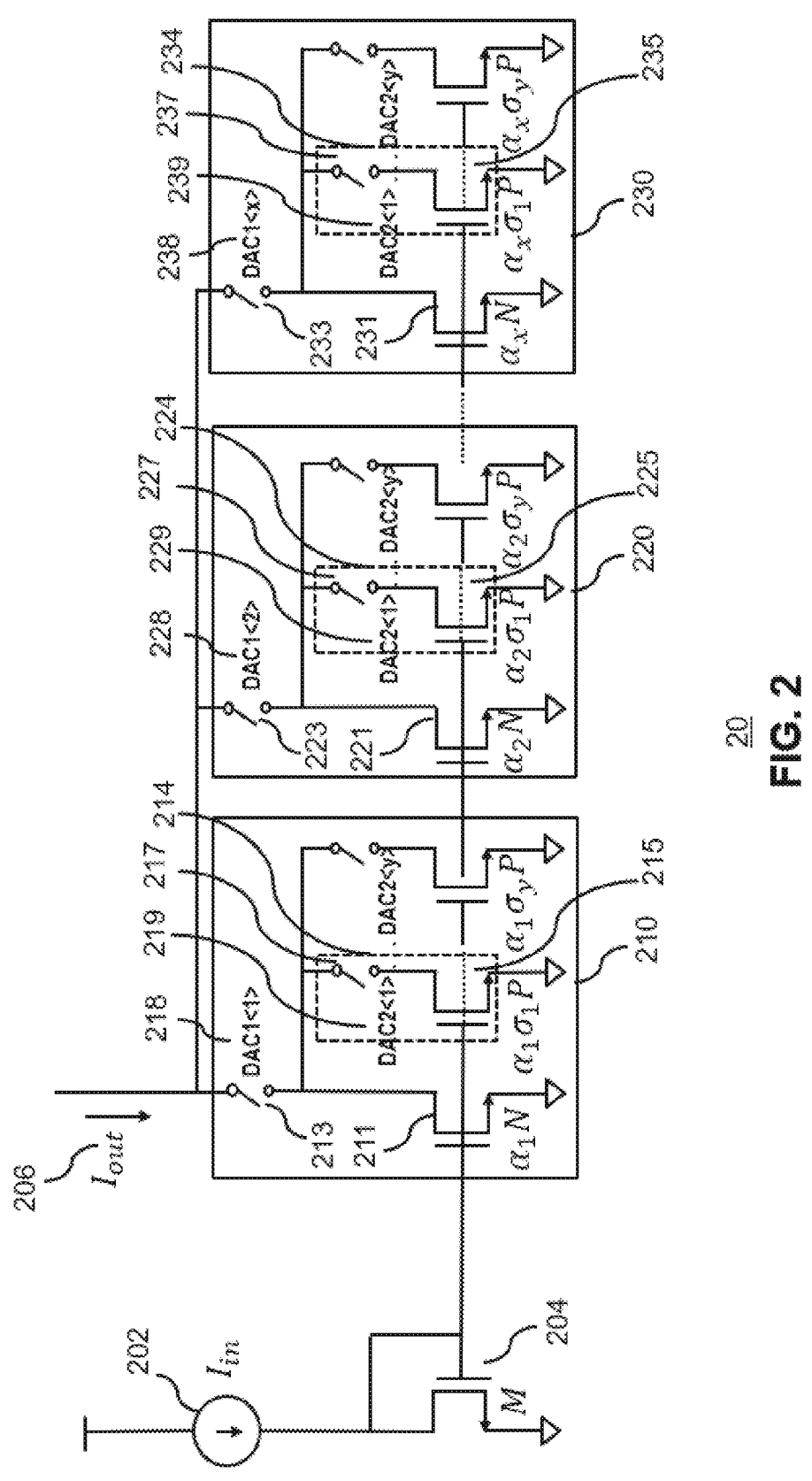
FIG. 2 is a schematic diagram of an example device in accordance with some embodiments.

FIG. 2 is a schematic diagram of an example device 20 in accordance with some embodiments. The device 20 includes a current source 202, circuitry to mirror the current source (e.g., a current generated by the current source), and a plurality of cells. In some examples, the device 20 may be a DAC configured to output a mirrored current as an output.

Referring to FIG. 2, the current source 202 may be or include a circuit, circuitry, or any component that generates a current (e.g., a reference current, an input current, etc.). The current source can be electrically coupled to a transistor 204 (hereinafter referred to as a reference transistor 204) of the circuitry and provide a current thereto. In some embodiments, the current source can be electrically coupled to a voltage supply. For example, the current source can be electrically coupled to a gate voltage (e.g., N-bias for N-Metal-oxide-semiconductor (MOS) device, P-bias for P-MOS device, etc.). In some embodiments, the current source can generate a constant and/or precise current.

Referring to FIG. 2, the circuitry or current mirror circuit described herein may be or include a circuit, circuitry, or any circuitry component that can copy a current (e.g., a reference current, an input current, etc.) through an active device by controlling the current in another active device, keeping an output current constant regardless of loading. The circuitry or current mirror circuit can include the reference transistor 204 and a plurality of output paths 210, 220, 230. The circuitry can output an output current 206 (e.g., a mirrored current) in response to the reference transistor 204 receiving a current from the current source 202. Although depicted to show only three paths, the plurality of output paths 210, 220, 230 can include any number of output paths.

In some embodiments, the reference transistor 204 may be a semiconductor device (e.g., a bipolar junction transistor (BJT), a MOS field-effect transistor (MOSFET), etc.), or any transistor that can control the current of the device 20. In some embodiments, the reference transistor 204 can be coupled to the current source 202 and receive a current from the current source 202. In response to receipt of the current from the current source 202, the reference transistor 204 can provide a signal (e.g., a voltage signal) to the plurality of output paths 210, 220, 230.

Referring to FIG. 2, any of the plurality of output paths 210, 220, 230 and/or a combination thereof may be or form a circuit, circuitry, or any component which can output at least a portion of the output current 206 (e.g., a mirrored current) in response to the reference transistor 204 receiving a current from the current source 202. The plurality of output paths 210, 220, 230 can in combination output the output current 206 to mirror the current from the current source 202 (e.g., an input current, a reference current). Each of the plurality of output paths 210, 220, 230 can include a switch (e.g., 213, 223, 233) and a transistor (e.g., 211, 221, 231). In some examples, the output current 206 may be an output signal of the DAC, output in response to receipt of the input current.

Referring to FIG. 2, the first transistors (e.g., 211, 221, 231) may be a semiconductor device (e.g., a BJT, a MOS-FET, etc.), or any transistor that can control a current flowing in the corresponding output path (e.g., 210, 220, 230). In some embodiments, the first transistor (e.g., 211, 221, 231) may be substantially similar or identical to the reference transistor 204. The first transistor (e.g., 211, 221, 231) can control a flow of a current in response to receipt of a signal (e.g., a voltage signal) from the reference transistor 204. In some embodiments, the first transistor (e.g., 211, 221, 231) may be coupled to a second transistor (e.g., 215, 225, 235) in the corresponding path of the plurality of output paths (e.g., 210, 220, 230).

Referring to FIG. 2, the first switch (e.g., 213, 223, 233) may be any semiconductor device (e.g., a BJT, a MOSFET, etc.), any semiconductor diode, any semiconductor switch, or any component that can control a current flow of the corresponding output path (e.g., 210, 220, 230) that the first switch is coupled to. The first switch (e.g., 213, 223, 233) can control a current flow in the corresponding output path thereby selectively configuring the corresponding first transistor (e.g., 211, 221, 231) or a set of transistors including the first transistor (e.g., 211, 221, 231) and the second transistor (e.g., 215, 225, 235) to output a portion of the output current 206 (e.g., a mirrored current), which can be combined into the output current 206. The first switch (e.g., 213, 223, 233) can be controlled to determine whether the corresponding output path (e.g., 210, 220, 230) is to close or open (e.g., allowing for a current flow or not in the corresponding output path). When the first switch (e.g., 213, 223, 233) is closed (or turned on), the first switch (e.g., 213, 223, 233) allows the corresponding current (e.g., a current from the first transistor, a sum of currents from the first transistor and the second transistor, etc.) to flow through the corresponding output path (e.g., 210, 220, 230) and combine into the output current 206 (e.g., a mirrored current). When the first switch (e.g., 213, 223, 233) is open (or turned off), the first switch (e.g., 213, 223, 233) disconnects the corresponding output path (e.g., 210, 220, 230) and prevents the corresponding current (e.g., a current from the first transistor, a sum of currents from the first transistor and the second transistor, etc.) from combining into the output current 206 (e.g., a mirrored current). By controlling which first switches are open or closed, the device can output the output current 206 (e.g., a current mirrored to the input current) by sum of the current(s) from the output path(s) whose first switch (e.g., 213, 223, 233) is closed.

In some embodiments, each of the plurality of output paths can correspond to a value of a respective bit of a first signal (e.g., 218, 228, 238). In some embodiments, the first signal (e.g., 218, 228, 238) may be a digital signal, a logical signal, a binary signal, or any signal that can represent data as a sequence of discrete values. The first switch (e.g., 213, 223, 233) of each of the plurality of output paths can be controlled by the first signal (e.g., the first digital signal) (e.g., 218, 228, 238), which can include a respective bit to control the corresponding switch. The first signal (e.g., 213, 223, 233) can control the output current 206 of the current mirror circuit. In some embodiments, the first signal (e.g., 213, 223, 233) can be an input signal to the DAC and can control an output signal of the DAC (e.g., the output current 206 of the current mirror circuit). For example, when the device includes X output paths, the first output path (e.g., 210) can be controlled by a first signal, e.g., DAC1<1> (e.g., 218) and the x-th output path (e.g., 230) can be controlled by a signal, e.g., DAC1<x> (e.g., 238). In some embodiments, the first switch can be configured to selectively couple the first transistor to the corresponding output path such that the first transistor outputs a current corresponding to the value of the respective bit of the first signal (e.g., 213, 223, 233). In some embodiments, the output current 206 (e.g., a mirrored current) can be output by selectively configuring each first transistor of the plurality of output paths. For example, the output current 206 can be an output signal of the DAC, output in response to receipt of the input current. In some embodiments, the first signal (e.g., 218, 228, 238) indicates a unary code.

Referring to FIG. 2, each of the plurality of output paths can include a plurality of cells (e.g., 214, 224, 234) electrically coupled to the corresponding first transistor (e.g., 211, 221, 231). As described herein, any of the plurality of cells (e.g., 214, 224, 234) can be or include a circuit, circuitry, or any circuitry component that includes a pair of a transistor and a switch. Although in each of the plurality of paths (e.g., 210, 220, 230), only a cell (e.g., 214, 224, 234) is shown with the dashed box, each of the plurality of output paths can include any number of cells, as shown. Each of the plurality of cells includes a second switch (e.g., 217, 227, 237) and a second transistor (e.g., 215, 225, 235). The second transistor (e.g., 215, 225, 235) may be a semiconductor device (e.g., a BJT, a MOSFET, etc.), or any transistor that can control a flow of a current in response to receipt of a signal (e.g., a voltage signal). In some embodiments, the second transistor (e.g., 215, 225, 235) may be substantially similar or identical to the first transistor (e.g., 211, 221, 231) and/or the reference transistor 204. The second transistor (e.g., 215, 225, 235) can provide the generated signal to the corresponding output path that the second transistor is coupled to. For example, the second transistor (e.g., 215, 225, 235) can be controlled to output a second current, which can be combined with a first current output from the first transistor (e.g., 211, 221, 231) coupled in the corresponding output path (e.g., 210, 220, 230). The combined current can flow into the corresponding output path by closing (or turning on) the first switch (e.g., 213, 223, 233).

Referring to FIG. 2, the second switch (e.g., 217, 227, 237) may be any semiconductor device (e.g., a BJT, a MOSFET, etc.), any semiconductor diode, any semiconductor switch, or any component that can control a current flow of a current path that the second switch is coupled to. As described herein, the current path may be or include a circuit, circuitry, or any circuitry component through which a current can flow. The second switch (e.g., 217, 227, 237) can be coupled to the second transistor (e.g., 215, 225, 235) and can control a current flow in the corresponding path thereby selectively configuring whether to combine a current output from the second transistor (e.g., 215, 225, 235) into the output current 206 (e.g., a mirrored current) in the corresponding output path. That is, the second switch (e.g., 217, 227, 237) can selectively couple the second transistor (e.g., 215, 225, 235) to the corresponding output path and allow the current output from the second transistor (e.g., 215, 225, 235) to combine with the current output from the first transistor (e.g., 211, 221, 231). The second switch (e.g., 217, 227, 237) can be controlled to determine whether the corresponding path is to close or open (e.g., allowing for a current flow or not in the corresponding path). When the second switch (e.g., 217, 227, 237) is closed, the second switch (e.g., 217, 227, 237) allows the corresponding current (e.g., a current from the second transistor) to flow through the corresponding output path and combine with a current from the first transistor (e.g., 211, 221, 231), thereby outputting a portion of the output current 206 (e.g., a mirrored current), the portion flowing through the corresponding output path of the plurality of out paths (e.g., 210, 220, 230). When the second switch (e.g., 217, 227, 237) is open, the second switch (e.g., 217, 227, 237) disconnects the corresponding output path and prevents the corresponding current (e.g., a current from the second transistor) from combining with the current from the first transistor (or from combining into the output current 206). By controlling which second switches (e.g., 217, 227, 237) are open or closed, the device can determine an amount of currents to combine with the current from the first transistor.

In some embodiments, each of the plurality of cells can correspond to a value of a respective bit of a second signal (e.g., a second digital signal, etc.) (e.g., 219, 229, 239). In some embodiments, the second signal may be a digital signal, a logical signal, a binary signal, or any signal that can represent data as a sequence of discrete values. The second switch (e.g., 217, 227, 237) of each of the plurality of cells (e.g., 214, 224, 234) can be controlled by the second signal (e.g., the second digital signal) (e.g., 219, 229, 239), which can include a respective bit to control the corresponding switch (e.g., the second switch). In some embodiments, when an output path of the plurality of output paths (e.g., 210, 220, 230) includes a first transistor (e.g., 211) and a first switch (e.g., 213) that are coupled to Y cells (the cells including the cell 214, that is, including Y second transistors and Y second switches), a current from the first (e.g., 214) of the Y second transistors (and/or the first (e.g., 217) of the Y second switches) can be controlled by a signal, DAC2<1> 219 and a current from the y-th of the Y second transistors (and/or the y-th of the Y second switches) can be controlled by a signal, DAC2<y>. In some embodiments, in response to the second switch (e.g., 217, 227, 237) of each of the plurality of cells (e.g., 214, 224, 234) selectively coupling the second transistor to the corresponding one of the plurality of output paths, the second transistor (e.g., 215, 225, 235) can be configured to output a current based on the value of the corresponding bit of the first digital signal (e.g., 218, 228, 238) and/or the value of the respective bit of the second digital signal (e.g., 219, 229, 239). In some embodiments, the second signal indicates a unary code.

In some embodiments, the second switches (e.g., 217, 227, 237) in the plurality of cells (e.g., 214, 224, 234) of the plurality of output paths (e.g., 210, 220, 230) can share a same digital signal. For example, the plurality of cells in the first output path (e.g., 210) of the plurality of output paths can receive the second signal DAC2<1:y>, and the plurality of cells in any output path (e.g., 220, 230) of the plurality of output paths can receive the same second signal DAC2<1:y>. That is, the second signal 219 of the output path 210 can be identical to the second signal 229 (and/or the second signal 239) of the output path 220 (and/or the output path 230). For example, each of the first cells in the plurality of output paths can receive DAC2<1>, each of the second cells in the plurality of output paths can receive DAC2<2>, and each of the y-th second cells in the plurality of output paths can receive DAC2<y>. As discussed above, a current contribution of the plurality of cells (e.g., 214, 224, 234) in each of the plurality of output paths (e.g., 210, 220, 230) to the output current 206 (e.g., a mirrored current) can be controlled by the first signal (e.g., 218, 228, 238), for example, DAC1<1:x>. For example, the plurality of cells in the first output path of the plurality of output paths can be controlled by the first signal, DAC1<1>, the plurality of cells in the second output path of the plurality of output paths can be controlled by the first signal, DAC1<2>, and the plurality of cells in the x-th output path of the plurality of output paths can be controlled by the first signal, DAC1<x>.

In some examples, the plurality of cells (e.g., 214, 224, 234) within each of the plurality of output paths (e.g., 210, 220, 230) can be integrated into a macro cell or a structure that includes the first corresponding transistor (e.g., 211, 221, 231) and the first corresponding switch (e.g., 213, 223, 233).

In some embodiments, the plurality of output paths (e.g., 210, 220, 230) and the plurality of cells (e.g., 214, 224, 234) can be configured to output the output current 206 corresponding to a result of multiplying a value of the first digital signal (e.g., 218, 228, 238) and a value of the second digital signal (e.g., 219, 229, 239), for example, an input signal being DAC1·DAC2. For example, the output current 206 can be a function of a result of multiplying a value of the first digital signal (e.g., 218, 228, 238) and a value of the second digital signal (e.g., 219, 229, 239). For example, the output current 206, $I_{out}$, may be, $$I_{out} = I_{in} \cdot \frac{DAC1 \cdot DAC2}{M},$$

where M is a ratio constant associated with the transistors and $I_{in}$ is a current generated by the current source 202 (e.g., a reference source). This allows for a multi-dimensional control of the output current 206 by independently adjusting the signals DAC1 and DAC 2.

In some embodiments, the plurality of output paths (e.g., 210, 220, 230) and the plurality of cells (e.g., 214, 224, 234) can be configured to output the output current 206 by weighting at least one of the current from any of the plurality of output paths (e.g., 210, 220, 230) or the current from any of the plurality of cells (e.g., 214, 224, 234). The weighting can be controlled by the first signal (received by the first switch, e.g., DAC1) and/or the second signal (received by the second switch, e.g., DAC2). For example, the weighting can be controlled by at least one of a step size, a relative signal size, a range of signals, etc. The output current 206, $I_{out}$, output by weighting can be defined as:

$$I_{out}(x, y) = I_{unit} \cdot \left( \sum\nolimits_{j=1}^{x} \alpha_j \right) \cdot \left[ N + P \cdot \left( \sum\nolimits_{k=1}^{y} \alpha_k \right) \right],$$

where x is a DAC1 input code indicating a first signal (e.g., DAC1), y is a DAC2 input code indicating a second signal (e.g., DAC2), $I_{unit}$ is $I_{in}/M$, N is a gain coefficient for DAC1, P is a gain coefficient for DAC2, $\alpha_j$ is a weighting for the j-th DAC1 of the plurality of output paths (e.g., 210, 220, 230), and $\alpha_k$ is a weighting for the k-th of the plurality of cells (e.g., 214, 224, 234).

In some embodiments, the device 20 may be or include a DAC configured to output a mirrored current of a current source (e.g., a reference current, an input signal, a current from the current source 202, etc.). In response to receipt of the first signal (e.g., DAC1) and the second signal (e.g., DAC2) as an input, the DAC can output a mirrored current as an output. For example, the first signal may be a first digital signal for coarse tuning of the output current 206 (e.g., an output signal of the DAC), and the second signal may be a second digital signal for fine tuning of the output current 206 (e.g., an output signal of the DAC).

Figure 3:
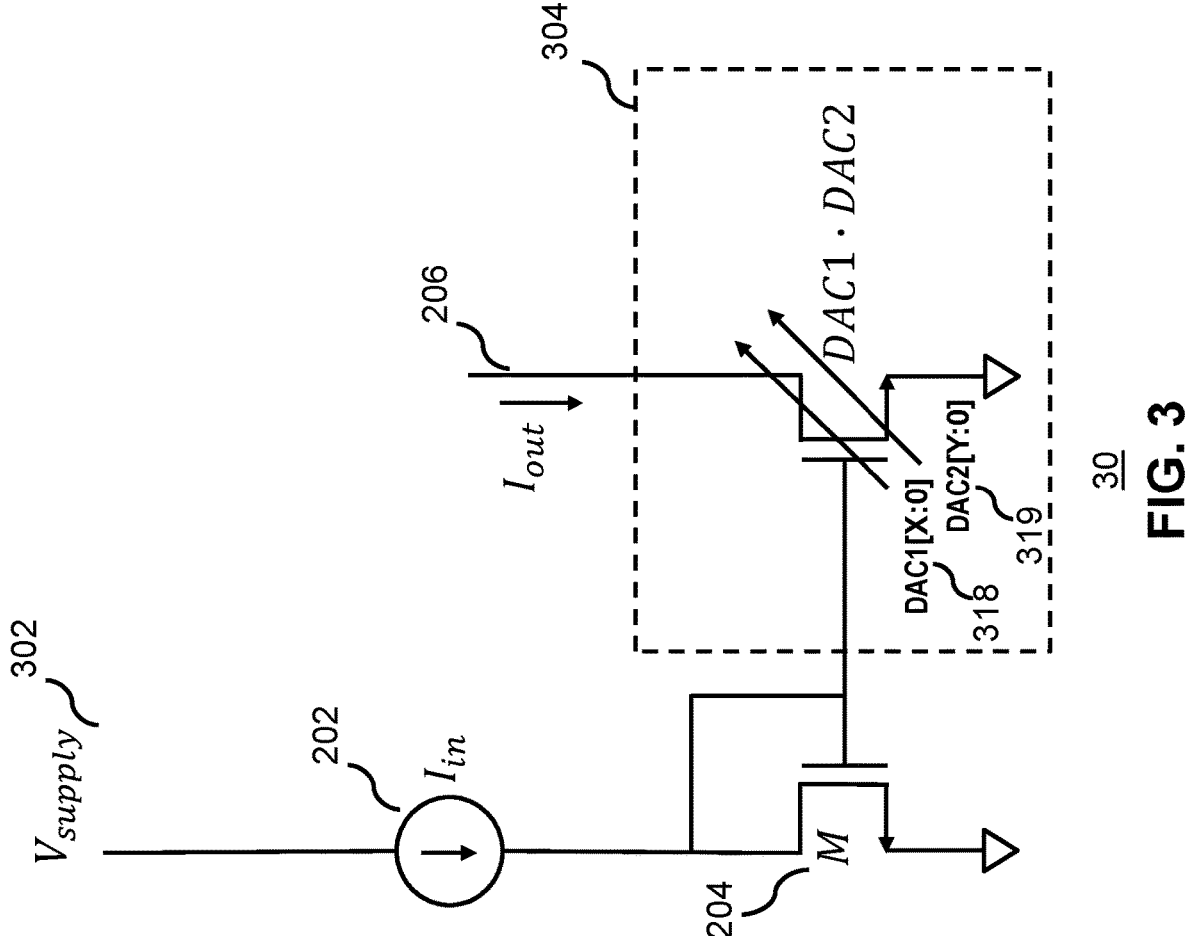
FIG. 3 is a schematic diagram equivalent of the device in accordance with some embodiments.

FIG. 3 is a schematic diagram 30 equivalent of the device 20 in accordance with some embodiments. More specifically, an equivalent output path 304 can represent the plurality of output paths (e.g., 210, 220, 230) and serve as a current mirror. The equivalent output path 304 can be controlled by a first signal 318 (e.g., 218, 228, 238) and a second signal 319 (e.g., 219, 229, 239). The output current 206, $I_{out}$, may be, $$I_{out} = I_{in} \cdot \frac{DAC1 \cdot DAC2}{M},$$

where M is a ratio constant associated with the transistors and $I_{in}$ is a current generated by the current source 202 (e.g., a reference source). In some embodiments, the diagram 30 may be an equivalent circuit of a multi-dimensional DAC configured to output a mirrored current as an output signal. The DAC can be controlled by the first signal 318 and the second signal 319 to output the output current 206 as an output signal of the DAC. The multi-dimensional DAC can be controlled by independently adjusting the first signal 318 and the second signal 319.

Figure 4:
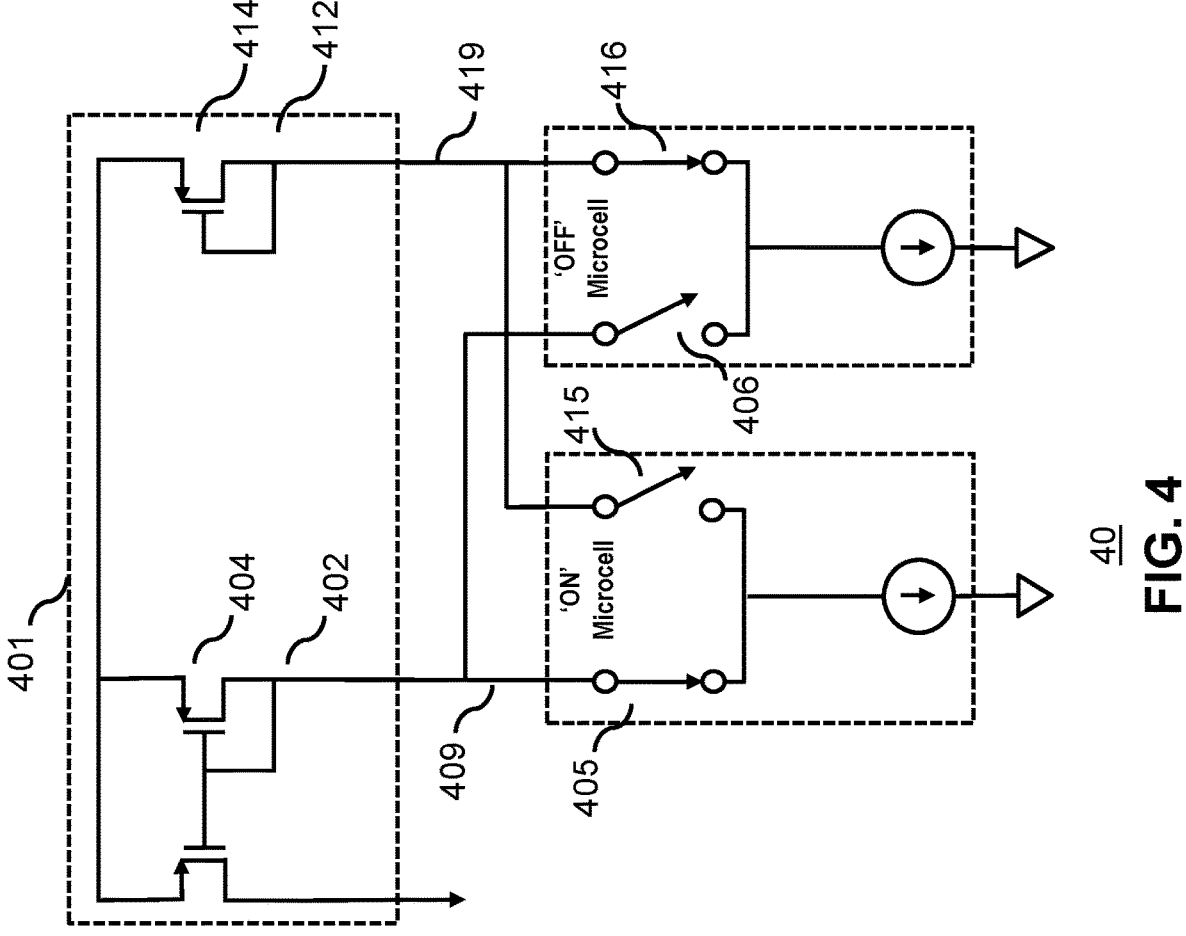
FIG. 4 is a schematic diagram of an example device in accordance with some embodiments.

FIG. 4 is a schematic diagram of an example device 40 in accordance with some embodiments. The device 40 can a device, a circuit, circuitry, or any component that can be integrated in the device 20. The device 40 may include an example DAC receiving circuit 401. The DAC receiving circuit 401 is a non-limiting example and it should be appreciated that the device 40 can be implemented with any variety of DAC receiving circuits while remaining within the scope of the present disclosure.

Referring to FIG. 4, the DAC receiving circuit 401 may include the plurality of output paths (e.g., 210, 220, 230) and/or the plurality of cells (e.g., 214, 224, 234), and may further include first circuitry 402 and second circuitry 412. The first circuitry 402 includes a third transistor 404 coupled to a plurality of third switches (e.g., 405, 406) corresponding to the plurality of cells (e.g., 214, 224, 234). For example, each of the plurality of third switches (e.g., 405, 406) can be electrically coupled to each corresponding cell of the plurality of cells (e.g., 214, 224, 234). The first circuitry 402 can mirror a current flowing through a first current path 409, which can be used to output an output current (e.g., a mirrored current) (e.g., 206). Each of the plurality of third switches (e.g., 405, 406) can be configured to selectively couple the corresponding cell of the plurality of cells (e.g., 214, 224, 234) to the first current path 409 based on the value of the respective bit of the second digital signal (e.g., 219, 229, 239), so that the output current (e.g., 206) can be provided through the first current path 409 to the corresponding output path (e.g., 210, 220, 230).

The second circuitry 412 includes a fourth transistor 414 coupled to a plurality of fourth switches (e.g., 415, 416) corresponding to the plurality of cells (e.g., 214, 224, 234). For example, each of the plurality of fourth switches (e.g., 415, 416) can be electrically coupled to each corresponding cell of the plurality of cells (e.g., 214, 224, 234). The second circuitry 412 can provide a second current path 419. Each of the plurality of fourth switches (e.g., 415, 416) can be configured to selectively couple the corresponding cell of the plurality of cells (e.g., 214, 224, 234) to the second current path 419 based on the value of the respective bit of the second digital signal (e.g., 219, 229, 239). The current provided through the second current path 419 may not be used.

In some embodiments, when a cell of the plurality of cells (e.g., 214, 224, 234) receives a bit of the second digital signal (e.g., 219, 229, 239) having a first value (e.g., 1, 0), the third switch (e.g., 405, 406) in the cell can be configured to couple the corresponding cell of the plurality of cells (e.g., 214, 224, 234) to the first current path 409 and the fourth switch (e.g., 415, 416) in the corresponding cell can be configured to disconnect the corresponding cell of the plurality of cells (e.g., 214, 224, 234) from the second current path 419. That is, in response to determining that a bit of the second digital signal (e.g., 219, 229, 239) has a first value, the third switch (e.g., 405, 406) of the plurality of third switches corresponding to the bit of the second digital signal (e.g., 219, 229, 239) can be configured to couple the corresponding cell of the plurality of cells (e.g., 214, 224, 234) to the first current path 409 and the fourth switch (e.g., 415, 416) of the plurality of fourth switches corresponding to the bit of the second digital signal (e.g., 219, 229, 239) can be configured to disconnect the corresponding cell of the plurality of cells (e.g., 214, 224, 234) from the second current path 419.

In some embodiments, when a cell of the plurality of cells (e.g., 214, 224, 234) receives a bit of the second digital signal (e.g., 219, 229, 239) having a second value (e.g., 0, 1), the third switch (e.g., 405, 406) in the cell can be configured to disconnect the corresponding cell of the plurality of cells (e.g., 214, 224, 234) from the first current path 409 and the fourth switch (e.g., 415, 416) in the cell can be configured to couple the corresponding cell of the plurality of cells (e.g., 214, 224, 234) to the second current path 419. That is, in response to determining that a bit of the second digital signal (e.g., 219, 229, 239) has a second value, the third switch (e.g., 405, 406) of the plurality of third switches corresponding to the bit of the second digital signal (e.g., 219, 229, 239) can be configured to disconnect the corresponding cell of the plurality of cells (e.g., 214, 224, 234) from the first current path 409 and the fourth switch (e.g., 415, 416) of the plurality of fourth switches corresponding to the bit of the second digital signal (e.g., 219, 229, 239) can be configured to couple the corresponding cell of the plurality of cells (e.g., 214, 224, 234) to the second current path 419.

Figure 5:
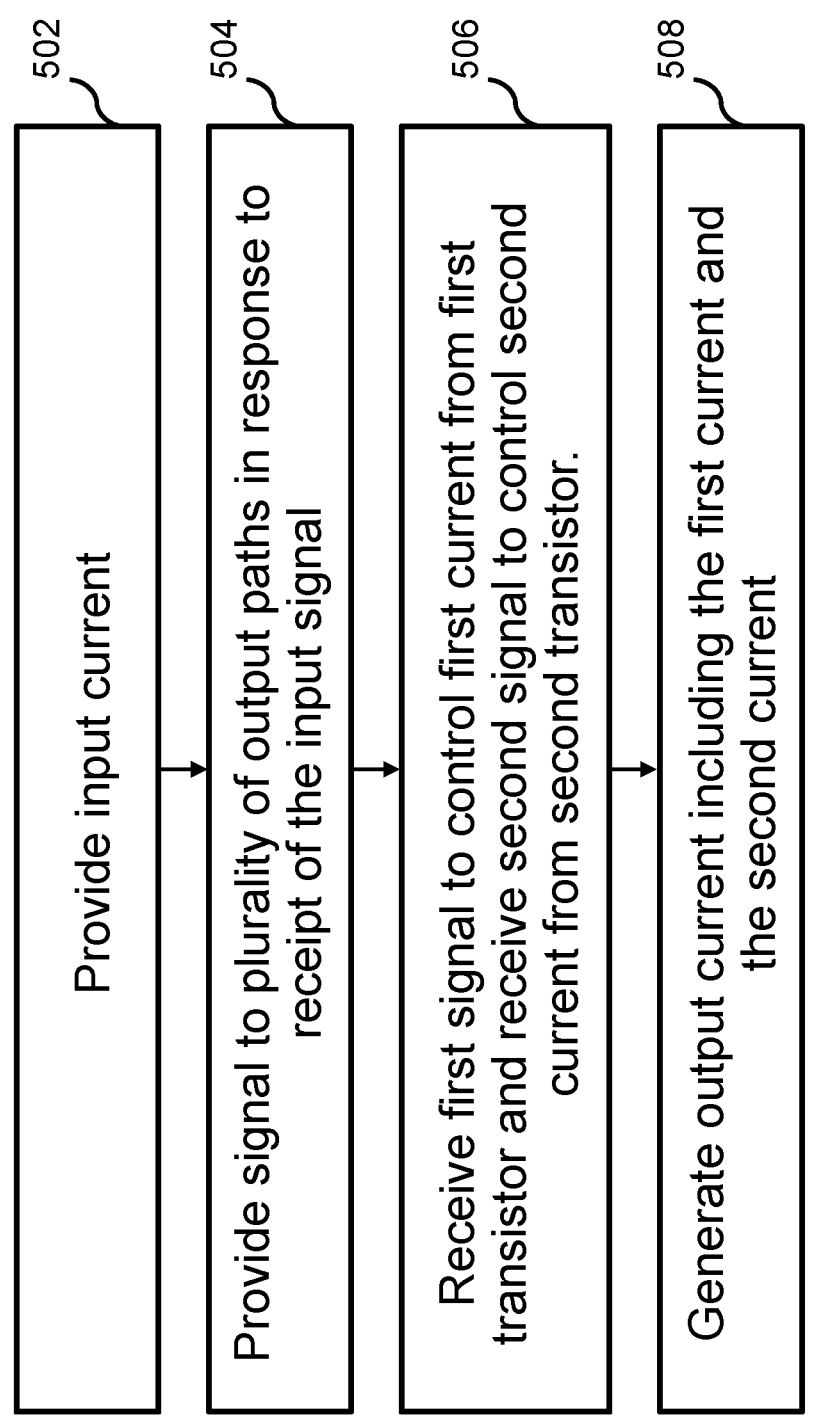
FIG. 5 is a flow diagram of an example process of operating a device in accordance with some embodiments.

FIG. 5 is a flow diagram of an example process 50 of operating a device in accordance with some embodiments. In some embodiments, the process 50 is performed by any of the device, system, or components thereof discussed above. For example, the process 50 can be performed using the device 20. In other embodiments, the process 50 is performed by other entities. In some embodiments, the process 50 includes more, fewer, or different steps than shown in FIG. 5.

At step 502, a current source (e.g., the current source 202 in FIG. 2) can provide an input current. The current source can provide the input current to a transistor (e.g., the reference transistor 204 in FIG. 2).

At step 504, in response to receipt of the input current, the transistor (e.g., the reference transistor 204 in FIG. 2) can provide a signal (e.g., a voltage signal) to a plurality of output paths (e.g., the output paths 210, 220, 230 in FIG. 2). Each of the plurality of output paths can include a first transistor (e.g., the first transistors 211, 221, 231 in FIG. 2) and a first switch (e.g., the first switches 213, 223, 233 in FIG. 2). Each of the plurality of output paths can include a second transistor (e.g., the second transistors 215, 225, 235 in FIG. 2) and a second switch (e.g., the second switches 217, 227, 237 in FIG. 2) that are electrically coupled to the corresponding first transistor and the corresponding first switch. Each of the second switches and the corresponding second transistor coupled thereto can form a cell (e.g., 214). Each of the first transistors and the second transistors can generate a current in response to receipt of the signal (e.g., a voltage signal) from the transistor (e.g., the reference transistor 204 in FIG. 2).

At step 506, each of the first transistors and each of the second transistors can receive a first signal (e.g., the first signals 218, 228, 238 in FIG. 2) and a second signal (e.g., the second signals 219, 229, 239 in FIG. 2), respectively. In response to receipt of the second signal, each of the second switches (e.g., the second switches 217, 227, 237 in FIG. 2) can control a flow of the corresponding current from the corresponding second transistor (e.g., the second transistors 215, 225, 235 in FIG. 2) coupled thereto. In each of the plurality of cells included in each of the plurality of output paths, when the corresponding second signal includes a value to close the corresponding second switch, a current is allowed to be output from the corresponding second transistor to the corresponding first switch (e.g., the first switches 213, 223, 233 in FIG. 2) and combine with a current from the corresponding first transistor (e.g., the first transistors 211, 221, 231 in FIG. 2). When the corresponding second signal includes a value to open the corresponding second switch, a current is not allowed to be output from the corresponding second transistor to the corresponding first switch.

In each of the plurality of output paths, when the corresponding first signal includes a value to close the corresponding first switch (e.g., the first switches 213, 223, 233 in FIG. 2), a current from the corresponding first transistors (e.g., the first transistors 211, 221, 231 in FIG. 2) and/or a current from the corresponding second transistor (e.g., the second transistors 215, 225, 235 in FIG. 2) are allowed to flow into the corresponding output path. When the corresponding first signal includes a value to open the corresponding first switch, a current is not allowed to flow into the corresponding output path.

At step 508, in response to control of the first switches and the second switches in the plurality of output paths, one or more of the plurality of output paths can provide a corresponding current (e.g., a current from the corresponding first transistors and/or a current from the corresponding second transistor) to generate an output current (e.g., the output current 206 in FIG. 2). The output current may be a sum of currents from one or more output paths whose corresponding first switch is closed.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining (for both terms "coupled" and "electrically coupled") may be stationary (e.g., permanent or fixed) or moveable (e.g., removable or releasable). Such joining (for both terms "coupled" and "electrically coupled") may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a stand-alone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A digital-to-analog converter (DAC), comprising:
   a current source;
   circuitry to mirror the current source, the circuitry comprising a transistor coupled to the current source, and a plurality of output paths; each output path of the plurality of output paths comprising a first switch to selectively configure a first transistor to mirror the current source, wherein each output path corresponds to a value of a respective bit of a first digital signal; and
   a plurality of cells, each cell of the plurality of cells comprising a second switch to selectively couple a second transistor to a corresponding one of the plurality of output paths, wherein each of the plurality of cells corresponds to a value of a respective bit of a second digital signal,
   wherein each of the first digital signal and the second digital signal indicates a unary code.

2. The DAC according to claim 1, wherein
   in selectively configuring the first transistor to mirror the current source, the first switch is configured to selectively couple the first transistor to the output path such that the first transistor outputs a current corresponding to the value of the respective bit of the first digital signal.

3. The DAC according to claim 1, wherein
   in response to the second switch of each of the plurality of cells selectively coupling the second transistor to the corresponding one of the plurality of output paths, the second transistor is configured to output a current based on the value of the corresponding bit of the first digital signal and the value of the respective bit of the second digital signal.

4. The DAC according to claim 1, wherein
the plurality of output paths and the plurality of cells are configured to output a current corresponding to a result of multiplying a value of the first digital signal and a value of the second digital signal.

5. The DAC according to claim 1, further comprising:
first circuitry to mirror a current flowing through a first current path, the first circuitry comprising a third transistor coupled to a plurality of third switches corresponding to the plurality of cells; and
second circuitry to provide a second current path, the second circuitry comprising a fourth transistor coupled to a plurality of fourth switches corresponding to the plurality of cells, wherein
each of the plurality of third switches is configured to selectively couple a corresponding one of the plurality of cells to the first current path based on the value of the respective bit of the second digital signal, and
each of the plurality of fourth switches is configured to selectively couple the corresponding one of the plurality of cells to the second current path based on the value of the respective bit of the second digital signal.

6. The DAC according to claim 5, wherein
in response to determining that a bit of the second digital signal has a first value, a switch of the plurality of third switches corresponding to the bit of the second digital signal is configured to couple a corresponding cell of the plurality of cells to the first current path and a switch of the plurality of fourth switches corresponding to the bit of the second digital signal is configured to disconnect the corresponding cell of the plurality of cells from the second current path, and
in response to determining that the bit of the second digital signal has a second value, the switch of the plurality of third switches corresponding to the bit of the second digital signal is configured to disconnect the corresponding cell of the plurality of cells from the first current path and the switch of the plurality of fourth switches corresponding to the bit of the second digital signal is configured to couple the corresponding cell of the plurality of cells to the second current path.

7. A system comprising:
a current source;
a transistor coupled to the current source;
a first digital-to-analog converter (DAC) comprising a plurality of first cells, each cell of the plurality of first cells comprising a first switch to selectively configure, corresponding to a value of a respective bit of a first digital signal, a first transistor to mirror the current source; and
a second DAC comprising a plurality of second cells, each cell of the plurality of second cells comprising a second switch to selectively couple, corresponding to a value of a respective bit of a second digital signal, a second transistor to a corresponding one of the plurality of first cells,
wherein the first DAC and the second DAC are configured to output a current corresponding to a result of multiplying values of the first digital signal and the second digital signal, and
wherein each of the first digital signal and the second digital signal indicates a unary code.

8. The system according to claim 7, wherein
in selectively configuring the first transistor to mirror the current source, the first switch is configured to selectively couple the first transistor to an output path such that the first transistor outputs, through the output path, a current corresponding to the value of the respective bit of the first digital signal.

9. The system according to claim 7, wherein
in response to the second switch of each of the plurality of second cells selectively coupling the second transistor to the corresponding one of the plurality of first cells, the second transistor is configured to output a current based on the value of the corresponding bit of the first digital signal and the value of the respective bit of the second digital signal.

10. The system according to claim 7, further comprising:
first circuitry to mirror a current flowing through a first current path, the first circuitry comprising a third transistor coupled to a plurality of third switches corresponding to the plurality of second cells; and
second circuitry to provide a second current path, the second circuitry comprising a fourth transistor coupled to a plurality of fourth switches corresponding to the plurality of second cells, wherein
each of the plurality of third switches is configured to selectively couple a corresponding one of the plurality of second cells to the first current path based on the value of the respective bit of the second digital signal, and
each of the plurality of fourth switches is configured to selectively couple the corresponding one of the plurality of second cells to the second current path based on the value of the respective bit of the second digital signal.

11. The system according to claim 10, wherein
in response to determining that a bit of the second digital signal has a first value, a switch of the plurality of third switches corresponding to the bit of the second digital value is configured to couple a corresponding cell of the plurality of second cells to the first current path and a switch of the plurality of second switches corresponding to the bit of the second digital value is configured to disconnect the corresponding cell of the plurality of second cells from the second current path, and
in response to determining that the bit of the second digital signal has a second value, the switch of the plurality of third switches corresponding to the bit of the second digital signal is configured to disconnect the corresponding cell of the plurality of second cells from the first current path and the switch of the plurality of fourth switches corresponding to the bit of the second digital signal is configured to couple the corresponding cell of the plurality of second cells to the second current path.

12. Circuitry comprising:
a current source;
a transistor coupled to the current source;
an output path comprising a first switch to selectively configure, corresponding to a bit of a first digital signal, a first transistor to mirror the current source; and
a plurality of cells, each cell of the plurality of cells comprising a second switch to selectively couple a second transistor to the output path, wherein each of the plurality of cells corresponds to a value of a respective bit of a second digital signal,
wherein each of the first digital signal and the second digital signal indicates a unary code.

13. The circuitry according to claim 12, wherein in selectively configuring the first transistor to mirror the current source, the first switch is configured to selectively couple the first transistor to the output path such that the first transistor outputs a current corresponding to the value of the bit of the first digital signal.

14. The circuitry according to claim 12, wherein in response to the second switch of each of the plurality of cells selectively coupling the second transistor to the output path, the second transistor is configured to output a current based on the value of the bit of the first digital signal and the value of the respective bit of the second digital signal.

15. The circuitry according to claim 12, wherein the output path and the plurality of cells are configured to output a current corresponding to a result of multiplying the value of the bit of the first digital signal and a value of the second digital signal.

16. The circuitry according to claim 12, further comprising:

first circuitry to mirror a current flowing through a first current path, the first circuitry comprising a third transistor coupled to a plurality of third switches corresponding to the plurality of cells; and second circuitry to provide a second current path, the second circuitry comprising a fourth transistor coupled to a plurality of fourth switches corresponding to the plurality of cells, wherein each of the plurality of third switches is configured to selectively couple a corresponding one of the plurality of cells to the first current path based on the value of the respective bit of the second digital signal, and each of the plurality of fourth switches is configured to selectively couple the corresponding one of the plurality of cells to the second current path based on the value of the respective bit of the second digital signal.

17. The circuitry according to claim 16, wherein in response to determining that a bit of the second digital signal has a first value, a switch of the plurality of third switches corresponding to the bit of the second digital signal is configured to couple a corresponding cell of the plurality of cells to the first current path and a switch of the plurality of fourth switches corresponding to the bit of the second digital signal is configured to disconnect the corresponding cell of the plurality of cells from the second current path, and in response to determining that the bit of the second digital signal has a second value, the switch of the plurality of third switches corresponding to the bit of the second digital signal is configured to disconnect the corresponding cell of the plurality of cells from the first current path and the switch of the plurality of fourth switches corresponding to the bit of the second digital signal is configured to couple the corresponding cell of the plurality of cells to the second current path.

* * * * *